United States Patent [19]
Heiblum et al.

[11] Patent Number: 5,712,491
[45] Date of Patent: Jan. 27, 1998

[54] LATERAL THETA DEVICE

[75] Inventors: Mordehai Heiblum, Yorktown Heights; Alexander Palevski, Ossining; Corwin Paul Umbach, Katonah, all of N.Y.

[73] Assignee: IBM Corporation, Armonk, N.Y.

[21] Appl. No.: 908,483

[22] Filed: Jun. 30, 1992

Related U.S. Application Data

[63] Continuation of Ser. No. 587,534, Sep. 21, 1990, abandoned, which is a continuation of Ser. No. 260,098, Oct. 20, 1988, abandoned.

[51] Int. Cl.⁶ ............................. H01L 29/24; H01L 29/68
[52] U.S. Cl. ............................. 257/26; 257/29
[58] Field of Search ............... 357/12, 16, 22 A, 357/33, 34, 4, 35; 257/26, 29

[56] References Cited

U.S. PATENT DOCUMENTS

| | | | |
|---|---|---|---|
| 4,286,275 | 8/1981 | Heiblum | 357/16 |
| 4,538,165 | 8/1985 | Chang et al. | 357/22 A |
| 4,663,643 | 5/1987 | Mimura | 357/22 A |
| 4,672,423 | 6/1987 | Fowler et al. | 357/23.14 |
| 4,675,711 | 6/1987 | Harder et al. | 357/23.15 |
| 4,772,932 | 9/1988 | Togashi et al. | 357/22 A |
| 4,847,666 | 7/1989 | Heremans et al. | 357/16 |
| 4,974,037 | 11/1990 | Beneking | 357/22 A |

FOREIGN PATENT DOCUMENTS

| | | | |
|---|---|---|---|
| 0191201 | 8/1986 | European Pat. Off. | 257/26 |
| 268136 | 5/1988 | European Pat. Off. | 357/22 A |

*Primary Examiner*—Donald Monin
*Attorney, Agent, or Firm*—Scully, Scott, Murphy and Presser

[57] ABSTRACT

A lateral THETA device formed of a sandwich of first and second layers of semiconductor material forming a heterojunction therebetween and a two dimensional carrier gas in the second layer. First and second spaced electrodes are disposed on the surface of the first layer for inducing first and second potential barriers to the flow of charge carriers in the carrier gas. Ohmic contacts are deposited in the base region defined between the electrodes and in the emitter and collector regions defined on opposing sides of the electrodes. The width of the first electrode is formed narrow enough so that the first potential barrier beneath the electrode permits tunnelling of charge carriers into the base region. The width of the second electrode is wide enough so that the second potential barrier prevents tunnelling. Electrons tunnelling through the first barrier are hot and ballistically move through the base region to the collector.

29 Claims, 2 Drawing Sheets

LATERAL THETA DEVICE

This is a continuation of application Ser. No. 07/587,534 filed on Sep. 21, 1990, now abandoned, which is a continuation of application Ser. No. 07/260,098, filed on Oct. 20, 1988, now abandoned.

This invention was partly supported by the Government under DARPA Project No. 2458, Contract No. N00014-87-C-079.

BACKGROUND OF THE INVENTION

1. Field of the Invention

This invention relates to ballistic transistors and more particularly, to tunnelling hot electron transfer amplifier devices.

2. Description of the Prior Art

The continued desire to expand the capacity of computers has been a major stimulus for research in developing faster switching transistors. Recently, transistors having ballistic action have been extensively investigated for providing ultrafast switching speeds. Ballistic action occurs when charge carriers travel at very high velocities through a semiconductor crystal lattice with little or no scattering. In order to create the ballistic action, charge carriers must be injected into active regions of a device, such as, into the base of a transistor.

One device exhibiting ballistic electron transfer is the tunnelling hot electron transfer amplifier (THETA) device first proposed by Heiblum in an article published in 24 Solid State Electronics, page 343 (1981). The THETA device is a vertical transistor having an emitter, base and collector of heavily doped n-type gallium arsenide (GAAS), separated by thin layers of undoped aluminum gallium arsenide (AlGaAs). The AlGaAs layers have a larger band gap than the GaAs layers creating an emitter barrier between the emitter and the base and a collector barrier between the base and the collector. In response to a positive voltage applied to the base with respect to the emitter, electrons will tunnel through the barrier between the emitter and the base and ballistically travel through the base layer toward the collector with a high velocity. The AlGaAs emitter barrier must be thin enough to allow tunnelling to occur. The ballistic or "hot" electrons having sufficient energy to surmount the barrier between the base and the collector are captured by the collector. The collector barrier must be thick enough to prevent tunnelling so that only the ballistic electrons will pass to the collector.

The vertical THETA device can achieve very short transit times because of the thinness of the layers that can be epitaxially grown. The thin layers, however, present fabrication difficulties in that the contacts must be very shallow to prevent shorting between layers and selective etching techniques are required to reach specific buried layers. In addition, there is a high series resistance due to the narrowness of the layers.

In addition, the AlGaAs barriers have a fixed potential height determined by the AlAs mole fraction in the alloy. The alloy is usually poorer quality material and some of the ballistic electrons are scattered in the material reducing the percentage of electrons that are transported thereby limiting the gain of the device.

A tunnelling horizontal field effect transistor is shown in U.S. Pat. No. 4,675,711 in which the source and drain regions are formed in a n+ GaAs layer and tunnelling occurs through the channel region in a AlGaAs layer below the GaAs layer. Another approach to fabricating high speed switching devices is the use of resonant transmission as shown in U.S. Pat. No. 4,672,423, which discloses a horizontal device having two small gates and a large gate vertically displaced over the small gates. The small gates produce two barriers controlled by the width and amplitude of the voltage applied to the gates. Resonant transmission occurs through a quantum well between the barriers formed due to the influence of the voltages applied to the gates.

SUMMARY OF THE INVENTION

The present invention is directed to a THETA type semiconductor device in which the emitter and collector barriers are formed in a two-dimensional electron gas (2DEG), without the AlGaAs barriers of the prior art THETA devices. The semiconductor device in accordance with the invention comprises a sandwich of a first and a second layer of semiconductor materials forming a heterojunction. The materials are preferably compound semiconductors from the III-V or II-VI groups. The first and second layers have a band gap difference and the first layer is selectively doped so that a two-dimensional carrier gas is formed in the second layer adjacent the heterojunction. The carrier gas may be either an electron gas or a hole gas depending upon the affinity of the dopants utilized. For example, the first layer may be AlGaAs selectively n-doped to provide an undoped AlGaAs spacer below the doped region. The second layer of the sandwich may be an undoped GaAs layer. A 2DEG would then be induced in the GaAs layer.

The device in accordance with the invention further includes first and second spaced electrodes disposed on the surface of the first layer for inducing first and second barriers to the flow of charge carriers in the carrier gas beneath the electrodes. The potential barriers are created by the application of a negative voltage to the electrodes with respect to the carrier gas to produce electric fields that raise the conduction band of the second layer above the Fermi level in the region of the 2DEG beneath the electrodes. The height of the barrier is controlled by the voltage applied to the electrodes. The first and second electrodes define a first active region between the electrodes and second and third active regions which extend on the opposite sides of the electrodes. Suitable contacts are deposited in each of the first, second and third regions in electrical contact with the carrier gas for applying electrical potentials to the regions. The first, second and third regions may act as the emitter, base and collector of a lateral THETA transistor.

The width of the barriers are controlled by the width of the electrodes deposited on the first layer. To form a tunnelling hot electron transistor amplifier the first electrode must have a width sufficiently narrow to create a correspondingly narrow first barrier that will permit tunnelling of the charge carriers through the barrier. To complete the novel lateral THETA device, the second electrode must have a width sufficient to induce the second barrier with a width that will prevent tunnelling of the charge carriers through the second barrier. Thus, a tunnelling injector and a collector barrier can be constructed by the deposition of two electrodes on the surface of the sandwich and applying a negative bias to the electrodes. The electrodes may take the form of metallic gates such as Schottky gates. In order to induce a tunnelling barrier, the emitter gate should have a width in the range of 100-400 angstroms and to induce a collector barrier, the collector gate should have a width in the range of 500-1,000 angstroms.

The separation between the two gates determines the base width, which is the region where ballistic transport will take place. The space between the gates should be on the order of the mean free path of the electrons in the base or less. In addition, it is possible to space the gates close enough to convert the 2DEG in the base to a 1DEG to further increase the number of electrons that are ballistically transported through the base region. Due to the narrowness of the space between the gates, difficulties may arise in depositing an ohmic contact to the base. Accordingly, there is also disclosed herein a novel technique for contacting the base in which a wide extension of the semiconductor base region includes tapered extensions of the gates that isolates the emitter and collector regions from the base extension while provide a larger area for depositing an ohmic contact. Electrical contact is made to the base through a 2DEG present in the base extension.

In another embodiment of the invention, a tunnelling field effect transistor is fabricated by utilizing a semiconductor sandwich as described above with a single metal gate to form a tunnel barrier in the 2DEG. The barrier in the 2DEG is the channel between the source and drain electrodes deposited on either side of the gate.

The THETA device of the invention may be operated in two modes. In a first mode, the negative potential applied to the emitter and collector gates is a constant voltage and the current flow and therefore the gain of the device is modulated by the signals applied to the emitter, base and collector. In the second mode, the emitter and base have a constant voltage and the current is modulated by changing the voltage applied to the emitter gate. This mode will provide an extra degree of freedom in certain applications.

The lateral THETA device of the present invention has many advantages over prior art ballistic transistors. The barrier heights can be easily controlled by the amplitude of the voltage applied to the gates. It is therefore possible to achieve high enough barriers that will allow operation at room temperatures. The lateral device may be easily fabricated as contacts can be readily formed on the layers and selective etching is not necessary. The number of ballistic electrons passing through the base to the collector and hence the gain of the device, will be increased as the ballistic mean free path should be longer since transport is occurring in an undoped region of a III-V semiconductor such as GaAs. The base resistance will be very small because of the high mobility of the 2DEG. As this device is a lateral device, the effective area will be extremely small resulting in a very small capacitance and a high frequency operating range. In addition, quantum mechanical reflections from the collector barrier will be very small due to the smoothness of the collector potential barrier.

DETAILED DESCRIPTION OF THE INVENTION

Figure 1:
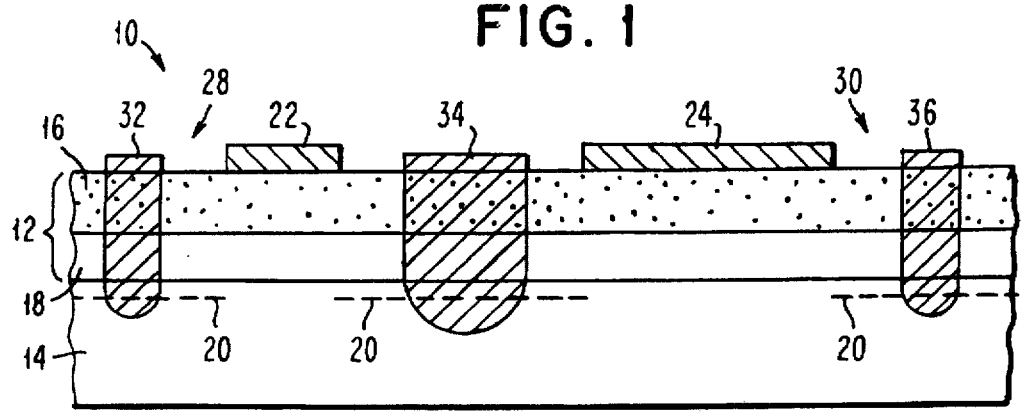
FIG. 1 is a schematic cross-sectional diagram of a lateral THETA device of the present invention.

Referring now to the drawings, FIG. 1 shows a schematic cross-section of the lateral THETA device 10 of the present invention which includes a first layer 12 of semiconductor material epitaxially grown on a second layer 14 of semiconductor material. The semiconductor materials utilized to form layers 12 and 14 are preferably group III-V compound semiconductor materials. Layer 12 is selectively n-doped to form an upper layer 16 of n-type material and a lower spacer layer 18 of undoped material. In one embodiment of the invention, layer 14 is GaAs and layer 12 is AlGaAs. Any III-V semiconductor materials may be utilized to form layers 12 and 14 provided that layer 12 has a higher band gap than layer 14. The band gap difference is necessary in order to form a 2DEG 20 in layer 14. As is well known, a 2DEG is formed at the heterojunction interface between AlGaAs and GaAs due to the separation of electrons from their parent impurities. AlGaAs has a higher band gap than GaAs and the AlGaAs layer is selectively n-doped with silicon to create an excess of electrons. The free electrons are transferred and accumulated in the GaAs layer adjacent the interface. The electrons are accumulated in a very narrow zone which constitutes the 2DEG. In a complementary device, a two-dimensional hole gas is formed provided that the AlGaAs layer 12 is selectively p-doped.

First and second spaced electrodes or gates 22 and 24 are deposited on the surface of layer 16. Upon the application of appropriate voltages to the gates 22 and 24, electric fields will be formed which will deplete the carriers in the region under the gates thereby forming the barriers. The gates 22 and 24 define the active regions of the device wherein the base region 26 is defined between the electrodes and the emitter region 28 and the collector region 30 are defined on opposite sides of the gate electrodes. Appropriate contacts 32, 34 and 36, are deposited in each of the regions for applying electrical potentials to the regions.

The application of a negative potential to the gates 22 and 24 with respect to the 2DEG 20 causes the conduction band of layer 14 to cross the Fermi level which induces a potential barrier for the electrons on both sides of the gates to build up. In the complementary device, in which the AlGaAs is selectively p-doped, an application of a positive potential with respect to the two dimensional hole gas would create the barriers.

Figure 3:
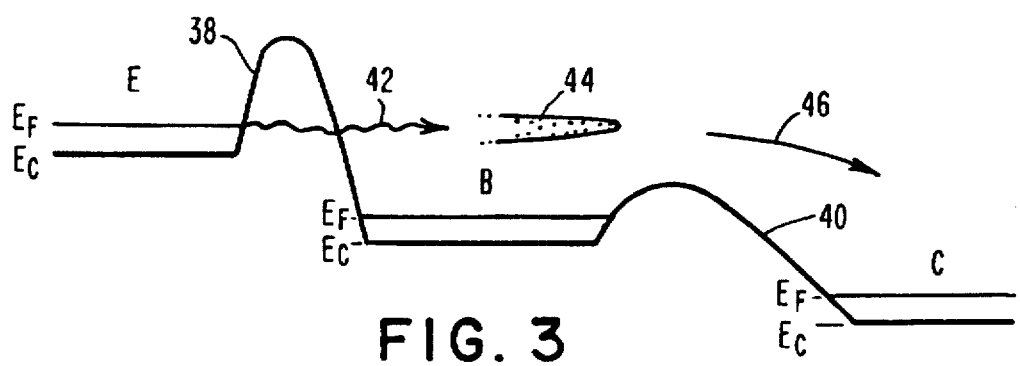
FIG. 3 shows the energy band diagram of the device of FIG. 1.

The potential barriers are shown in the energy band diagram of FIG. 3. The barrier 38 is induced in the region of the 2DEG beneath electrode 22 and barrier 40 is induced in the region of the 2DEG beneath the electrode 24. In addition, the width of each electrode will determine the width of the respective barrier. Pursuant to quantum-mechanical theory, by fabricating gate 22 very narrow, the barrier 38 will be thin enough to allow electrons to tunnel through the barrier. Typically, the gate 22 will be fabricated with a width $X_1$ in the range of 100–400 angstroms. The width $X_2$ of gate 24 will be in the range between 500–1,000 angstroms which will provide the barrier 40 with a width sufficient to prevent tunnelling. The gates 22 and 24 are much narrower than the length $Y_1$ of the active regions, which typically is on the order of one micron. The gates 22 and 24 can be fabricated to such a narrow scale by utilizing existing nano-photolithography techniques.

In operation, as shown in FIG. 3, electrons, designated by arrow 42, at a sufficiently high voltage, will tunnel through barrier 38 from the emitter to the base and ballistically transport through the base region. The electrons will enter the base with an energy approximately equal to the electron charge times the applied voltage which is much greater than the energy of the conduction electrons already in the 2DEG. The electrons are "hot" and the emitter barrier 38 can be regarded as a tunnelling ballistic injector. The hot electrons enter the base in a well-collimated beam as represented by 44. At high enough energy, the electrons can traverse the base at the limiting velocity imposed by the electronic structure of the semiconductor. For GaAs, this velocity is about $10^8$cm/s. Since the second barrier 40 is thick enough to prevent tunnelling, only those electrons with enough kinetic energy to pass over the barrier 40, as represented at 46, will be collected by the collector.

The voltages that are applied to the gate electrodes 22 and 24 depend on the desired barrier height as the height is dependent upon the amplitude of the voltage. In addition, the barrier height is also dependent upon the configuration of the device including the thickness of the layers and the width and length of the regions. For example, in one illustrative embodiment, layer 16 is about 400 angstroms thick having a doping of $1\times10^{18}$cm$^{-3}$, layer 18 is approximately 50–100 angstroms thick and the length of the active region, shown in FIG. 2 as $Y_1$, is about one micron. A typical gate voltage applied to this device would be from −0.5 to −2.0 volts. The Fermi energy level $E_F$ is above the conduction band energy level $E_c$ by approximately 30 meV for a charge density of the 2DEG on the order of $10^{12}$cm$^{-2}$. The barrier height of the barriers 38 and 40 would therefore be about 40 meV or higher.

The tunnelling currents strongly depend on the barrier height so that a small gate voltage will result in a large change in the tunnelling current leading to a large transconductance. For small biasing voltages, $J \equiv A\exp(-B\Phi^{1/2})$, where A, B are constants and $\Phi$ is the barrier height, the transconductance will be $\Gamma m = (dJ/d\Phi)(d\Phi/dVg)$, where $V_g$ is the gate voltage. The large transconductance also results from the strong dependence of $\Phi$ on the gate voltage at low temperatures.

The time that it takes electrons to tunnel through the tunnel barrier would be on the order of $10^{-14}$ seconds or less. The transit time through the base to the collector would be on the order of $2\times10^{-13}$ seconds. The utilization of a 2DEG for transporting carriers inherently increases the speed due to the high mobility of a 2DEG which results in a reduced base resistance. By reducing the RC time constant of the device and increasing the current density it is therefore possible to achieve sub-picosecond operation.

Figure 2:
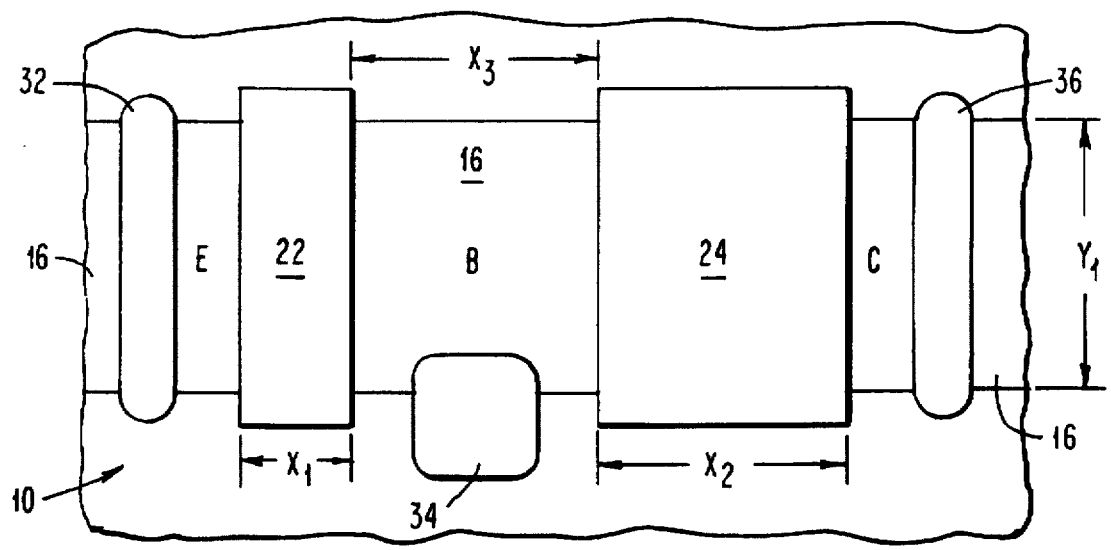
FIG. 2 is a schematic top view of the device of FIG. 1.

In order to ensure ballistic transport in the base, the space between the electrodes 22 and 24, shown as $X_3$ in FIG. 2, should be on the order of the mean free path of the electrons in the base or less. The mean free path is the average distance an electron can travel between collisions in a crystal lattice. The mean free path depends on such factors as the electron energy and the temperature of the crystal. The mean free path of the electrons in the device of the present invention should be longer than in the vertical THETA device as the transport is occurring in a 2DEG. For the device as described in the above illustrative example, the spacing $X_3$ is expected be about 1,000–2,000 angstroms or less. It is possible, however, to reduce the spacing between electrodes 22 and 24 to such a degree to reduce or convert the 2DEG into a 1DEG. A 1DEG is defined as a single line of electrons along the length of the base region. When this occurs, the number of ballistic electrons passing through the base to the collector could be significantly increased thereby further increasing the gain of the device.

Figure 4:
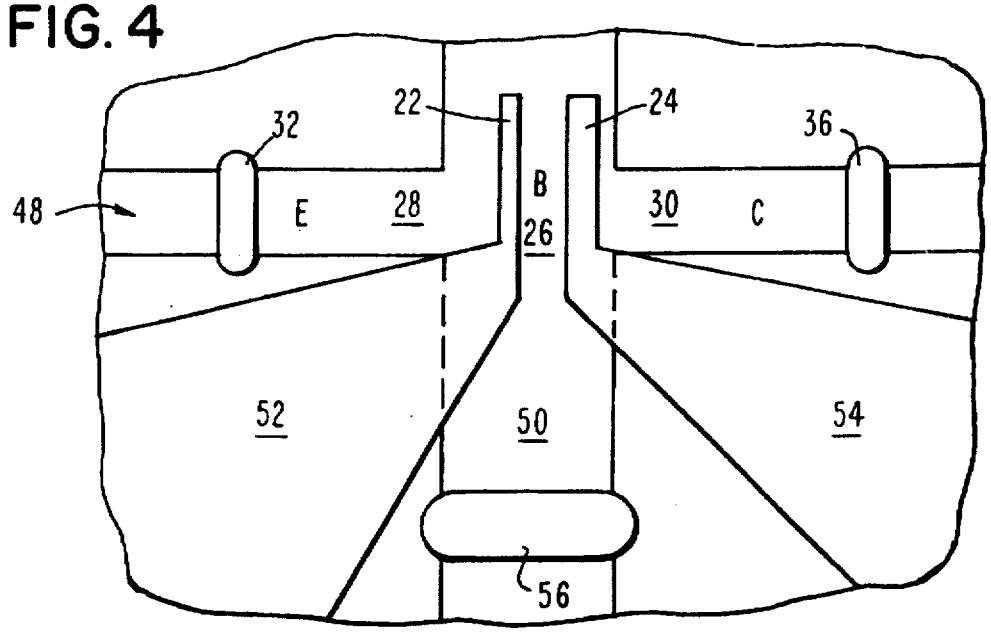
FIG. 4 is a schematic top view of the novel base contact arrangement of the present invention.

Significantly reducing the spacing between electrodes 22 and 24 will make it exceedingly difficult to contact the base region. One technique for providing an ohmic contact to the base region is shown in FIG. 4. In FIG. 4 there is shown the active channel 48 which includes the emitter, base and collector regions fabricated with a relatively wide right angle extension region 50 extending from the base region 26 which is comprised of the same semiconductor materials forming the base region 26. Thus, the 2DEG will be present throughout channel 48 and extension 50. The gate electrodes 22 and 24 include tapered extensions 52 and 54 that overlap the region 50. When a negative voltage is applied to the gates with respect to the electrons in the 2DEG to form the barriers in the THETA device, the portion of the 2DEG in the extended region 50 covered by the extensions 52 and 54 will be depleted of charge carriers. Thus, electrical contact will be prevented between the region 50 and the emitter 28 and collector 30 of the THETA device. A base contact 56 is then deposited in the wide area of the region 50 in electrical contact with the 2DEG in that region which in turn, is in electrical contact with the 2DEG within the base region 26. The width of the region 50 should be approximately twice as large as the channel region 48 or greater.

In one operating mode of the THETA device of the invention, the negative potential applied to the gate electrodes 22 and 24 will be fixed throughout the entire operation of the device. The gain of the device will be controlled by the various voltages applied to the emitter, base and collector. In another operating mode, a constant voltage is applied between the emitter and the base for injecting a hot electron beam that proceeds ballistically through the base and over the collector barrier to the collector. The output voltage doesn't affect the output current to the first order, resulting in a high differential output resistance. The current would then be modulated with the input signal applied to the emitter gate while keeping the energy of the ballistic hot electrons fixed. The base can therefore be modified to create transport windows or minibands, which may be resonances, that could be utilized to increase the device gain. Utilizing the THETA device in this matter would provide isolation between the input and output. The two gate electrodes in this mode would provide another degree of freedom to circuit designers.

Figure 5:
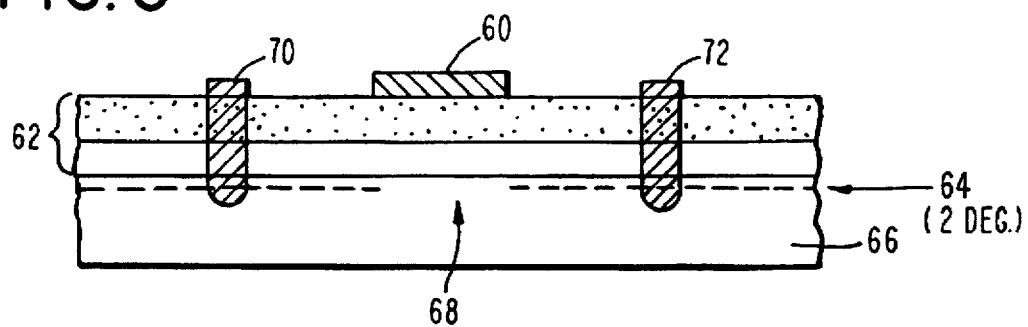
FIG. 5 is a schematic cross-sectional diagram of a tunnel FET of the present invention.

In another embodiment, as shown in FIG. 5, the lateral THETA configuration could be utilized to form a tunnelling field effect transistor. In this embodiment, a single metal gate 60 is deposited on selectively doped layer 62 and a channel would be formed in the 2DEG 64 in layer 66 in the area 68 beneath the gate. A source contact 70 and a drain contact 72 would be provided in the semiconductor layers to contact the 2DEG. The gate 60 is deposited with a width narrow enough to create a tunnel barrier in the 2DEG at 68. The application of the negative voltage to gate 60 will cause electrons to tunnel from the source 70 through the barrier 68 to the drain 72. Two or more gates may be provided identical to gate 60 to create two or more tunnel barriers. The additional tunnel barriers may be utilized for fabricating back to back FETs.

Figure 6:
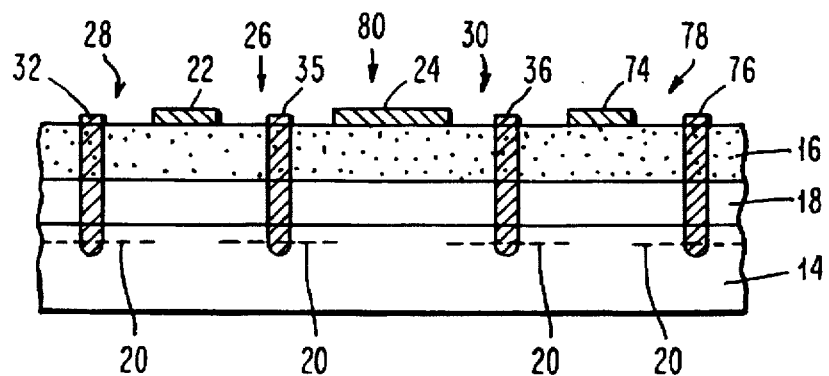
FIG. 6 is a schematic cross-sectional diagram of a three barrier lateral THETA device of the present invention.

In a further embodiment, the device of FIG. 1 could be modified by providing a second tunnel barrier electrode 74 on the opposite side of electrode 24. The device 80 as shown in FIG. 6 would also include a fourth contact 76 in region 78. A device such as device 80 would provide additional flexibility to circuit designers as the direction of current flow could be selected by applying bias voltages to either electrode 22 or electrode 74, and to electrode 24. If bias voltages are applied to electrodes 22 and 24, then current flow would be as shown in FIG. 3 and the region 78 would not be active. If bias voltages are applied to electrodes 24 and 74, then current flow would be opposite to that of FIG. 3 with region 28 being inactive. In a lateral THETA device in which current flow is in the direction from region 78 to region 26, region 78 would be the emitter, region 30 would be the base and region 26 would be the collector.

While the invention has been particularly shown and described with respect to preferred embodiments, it will be understood by those skilled in the art that the foregoing and other changes in form and details may be made therein without departing from the spirit and scope of the invention.

Having thus described the invention, what is claimed as new, and is desired to be secured by Letters Patent is:

1. A lateral semiconductor device comprising:

a sandwich of a first layer of semiconductor material having a first electron affinity and a second layer of semiconductor material having a second electron affinity different from that of said first layer, said second layer forming a heterojunction with said first layer, the difference between said first and second electron affinities allowing the formation of a two dimensional carrier gas in said second layer adjacent the heterojunction;

first and second spaced electrodes disposed on the surface of said first layer for inducing first and second barriers to the flow of charge carriers in said carrier gas, said first and second electrodes defining a first region of said sandwich between said electrodes and second and third region of said sandwich extending beyond said electrode along the length of said device, and the width of said electrode being sufficiently narrow to induce said barrier with a sufficiently narrow width to permit tunnelling of charge carriers through said first barrier which are then ballistically transported through said first region; and means in electrical contact with said carrier gas for applying electrical potentials to said first, second and third regions.

2. The device of claim 1 wherein the width of said second electrode is sufficient to induce said second barrier with a width sufficient to prevent tunnelling of charge carriers through said second barrier.

3. The device of claim 2 wherein the spacing between said first and second electrodes is on the order of or less than the mean free path of charge carriers in the first region.

4. The device of claim 2 wherein the means for applying electrical potentials to said first, second and third regions includes ohmic contacts in direct contact with said two dimensional carrier gas.

5. The device of claim 3 wherein said means for applying an electrical potential to said first region includes a fourth region of said sandwich extending from said first region and having a width greater than the width of said first region and an ohmic contact deposited in said fourth region.

6. The device of claim 5 wherein the fourth region includes a two dimensional carrier gas in contact with the two dimensional carrier gas in said first region and said ohmic contact is in electrical contact with the two dimensional carrier gas in said fourth region.

7. The device of claim 6 wherein said first and second electrodes include spaced first and second extensions disposed over said fourth region for depleting charge carriers in said two dimensional gas below said extensions to prevent electrical contact between said fourth region and said second and third regions through said carrier gas.

8. A lateral THETA semiconductor device comprising:

a first type of III–V compound semiconductor having a first electron affinity;

a second layer of III–V compound semiconductor material having a second electron affinity different from that of said first layer and forming a heterojunction with said first layer, the difference between said first and second electron affinities allowing the formation of a 2DEG in said second layer adjacent said heterojunction;

first and second spaced electrodes disposed on the surface of said first layer for inducing first and second potential barriers to the flow of charge carriers in said 2DEG upon the application of a negative potential to said first and second electrodes with respect to said 2DEG, said first and second electrodes defining a base region between said electrodes and emitter and collector regions on opposing sides of said base region, the width of said first electrode being sufficiently narrow to allow tunnelling of charge carriers through said first barrier which are then ballistically transported through said base region;

means in electrical contact with said 2DEG for applying electrical potentials to said base, emitter and collector regions.

9. The device of claim 8 wherein the width of said second electrode is sufficient to induce said second potential barrier with a width sufficient to prevent tunnelling of charge carriers through said second barrier.

10. The device of claim 9 wherein the spacing between said first and second electrodes is on the order of or less than the mean free path of charge carriers in the first region.

11. The device of claim 9 wherein the means for applying electrical potentials to said first, second and third regions includes ohmic contacts in direct contact with said two dimensional carrier gas.

12. The device of claim 8 wherein the second semiconductor layer is GaAs.

13. The device of claim 12 wherein the first semiconductor layer is AlGaAs.

14. The device of claim 13 wherein the first semiconductor layer is selectively doped n-type to provide an upper n-doped layer and a lower undoped spacer layer within said first layer.

15. The device of claim 8 wherein the spacing between the first and second electrodes is in the range of 1,000–2,000 angstroms.

16. The device of claim 8 wherein the width of the first electrode is in the range of 100–400 angstroms.

17. The device of claim 16 wherein the width of the second electrode is in the range of 500–1,000 angstroms.

18. A lateral tunnelling ballistic electron semiconductor device comprising:

a sandwich of a first and a second layer of semiconductor material forming a heterojunction therebetween and a 2DEG in said second layer adjacent the heterojunction;

means disposed on the surface of said first layer for inducing at least one tunnel barrier in said carrier gas.

19. The device of claim 18 further including means in electrical contact with said 2DEG for applying electrical potentials to first and second regions of said sandwich defined on opposing sides of said inducing means.

20. The device of claim 19 wherein said inducing means includes at least one metal gate having a width sufficient to induce said at least one tunnel barrier with a width to permit tunnelling of charge carriers through said at least one barrier.

21. The device of claim 20 wherein the at least one metal gate is a Schottky gate.

22. The device of claim 21 wherein the first and second layers of semiconductor material are formed from group III–V materials.

23. The device of claim 22 wherein the first layer is formed of AlGaAs and the second layer is formed of GaAs.

24. The device of claim 23 wherein the width of the at least one metal gate is in the range of 100–400 angstroms.

25. The device of claim 19 wherein said inducing means includes first and second electrodes each having a width sufficient to induce a tunnel barrier in said 2DEG and further including a third electrode having a width sufficient to induce a barrier in said 2DEG preventing tunnelling disposed intermediate that first and second electrodes, said second region of said sandwich being defined between said first and third electrodes.

26. The device of claim 25, further including means in electrical contact with said 2DEG for applying electrical potentials to a third region of said sandwich defined between said second and third electrodes and to a fourth region of said sandwich defined outside said second electrode.

27. The device of claim 26, wherein the first, second and third electrodes are metallic gates.

28. The device of claim 27 wherein the first and second layers of semiconductor material are formed from group III–V materials.

29. The device of claim 28 wherein the first layer is formed of AlGaAs and the second layer is formed of GaAs.

* * * * *